United States Patent [19]

Kelly et al.

[11] Patent Number: 4,672,567
[45] Date of Patent: Jun. 9, 1987

[54] MEDIAN FILTER FOR REDUCING DATA ERROR IN DISTANCE MEASURING EQUIPMENT

[75] Inventors: Robert J. Kelly; Danny R. Cusick, both of Baltimore, Md.

[73] Assignee: Allied Corporation, Morristown, N.J.

[21] Appl. No.: 702,764

[22] Filed: Feb. 19, 1985

[51] Int. Cl.$^4$ .................. G06F 15/353; G05D 1/02
[52] U.S. Cl. ............................... 364/572; 364/561; 364/724
[58] Field of Search ............ 364/451, 456, 561, 572, 364/724; 343/7.7, 12 R, 398, 418, 458

[56] References Cited

U.S. PATENT DOCUMENTS 3,998,410 12/1976 Smith ........................... 364/451 X
4,128,835 12/1978 Russell ....................... 343/12 R X
4,455,556 6/1984 Koshio et al. ................. 364/561 X

FOREIGN PATENT DOCUMENTS 1523729 9/1978 United Kingdom ............... 364/724

OTHER PUBLICATIONS

Oflazer: Design and Implementation of a single chip 1-D Median Filter, IEEE Transactions on Acoustics, Speech, and Signal Processing. vol. ASSP-31, No. 5, Oct. 1983, pp. 1164-1168.

Wolfe et al.: Fast Media Filter Implementation, SPIE vol. 207, Applications of Digital Image Processing III--1979 pp. 154-160.

Kanyuck: Transient Response of Tracking Filters with Randomly Interrupted Data, IEEE Transactions on Aerospace and Electronic Systems, vol. AES-6, No. 3, May 1970 pp. 313-323.

Robinson et al.: Principles of Digital Filtering, Geophysics vol. 29, No. 3, Jun. 1964 pp. 395-404.

*Primary Examiner*—Felix D. Gruber
*Attorney, Agent, or Firm*—B. L. Lamb; R. M. Trepp

[57] ABSTRACT

A set containing an odd number N of successive raw range data samples from precision distance measuring equipment is established. The set is arranged in ascending order of sample magnitude. The median member of the ordered set, i.e. the $(N-1/2+1)$ member, is selected for processing in an alpha-beta type digital filter. The filter output is compensated for the delay introduced by using the median member of the set as the input to the alpha-beta filter. The compensated filter output is utilized as the distance input signal to a display or aircraft flight control system.

6 Claims, 7 Drawing Figures

MEDIAN FILTER FOR REDUCING DATA ERROR IN DISTANCE MEASURING EQUIPMENT

The present invention relates to precision distance measuring equipment. More particularly, it relates to a method of filtering the data output of airborne precision distance measuring equipment to reduce the errors therein.

Distance measuring equipment (DME) as presently conventionally utilized is an enroute navigational aid for aircraft which provides continuous indications of distance between an interrogating aircraft and a selected ground station for ranges between approximately 0.2 and 300 nautical miles (nm) with an accuracy of approximately 0.1 nm. A microwave landing system has recently been internationally approved which provides substantial improvement in the accuracy of elevation and azimuth angular guidance to the aircraft. Full implementation of the microwave landing system to provide automatic control to an aircraft for final approach and landing requires precision distance measuring equipment operating with an accuracy of 100 feet between the ranges of 0 and 22 nm from an airport.

Both the conventional DME (DME/N) and the precision DME (DME/P) determine the distance between an aircraft and a ground station by measuring the time elapsing between transmission of an interrogation signal by the aircraft and receipt at the aircraft of a ground station reply to such interrogation. The ground station is indifferent to the identity of the interrogating aircraft and simply replies, after a fixed delay, to each valid interrogation signal without regard to the source of such interrogation signal. Each aircraft interrogator must therefore include means for distinguishing reply signals received in response to its own interrogations from reply signals which have been transmitted in response to interrogations from other aircraft. Such means comprise search and tracking range gates whereby reply signals appearing at a coherent range are accepted as replies to an aircraft's own interrogation signals and other replies are rejected.

Garble, an interference mechanism inherent to DME, occurs when the desired pulse (interrogation or reply) is coincident with a pulse from other DME equipment or non-DME pulsed signal sources. Garble may cause a pulse time-of-arrival error or may cause pulse distortion so severe that the desired signal fails to satisfy any of the criteria required of a valid DME signal. The problems posed by garble are more severe in the precision DME system where the IF bandwidths used are much wider than those in use in conventional DME, thus increasing the exposure of the desired signal to the garble environment, and where the accuracy requirements of precision DME are more stringent than those of conventional DME.

Downlink garble occurs when valid interrogations at the ground transponder are coincident with interrogations from other aircraft resulting in loss of signal (and consequently no transponder reply) or in time-of-arrival measurement errors. The garble can be on-channel interference from aircraft in the same service volume or it can be interference from aircraft whose interrogations are intended for other transponders within the bandwidth of the serving transponder. This undesired air-to-ground loading is a function of the number of interrogating aircraft in the vicinity of the serving transponder and the corresponding distribution of interrogation frequencies and signal amplitudes received at the transponder.

Uplink garble occurs when valid replies at the interrogator are coincident with transmissions by other transponders with different service volumes and results in loss of signal (missing data) or pulse time-of-arrival measurement errors. The garble can be interference from any transponder whose frequency is within the bandwidth of the interrogator, including those on the same frequency, but with different pulse coding. This undesired ground-to-air loading is a function of the number of transponders in the vicinity of the interrogator and the corresponding distribution of reply frequencies and signal amplitudes received at the interrogator.

Range measurement errors resulting from garble are typically of large amplitude and occur only with some probability on a given interrogation with the probability of occurrence dependent upon the number of interfering pulses in the environment. Other DME/P error mechanisms include multipath, where the desired signal is distorted by the presence of a reflected signal, and by receiver noise. Unlike garble, multipath and receiver noise errors will occur on each interrogation and are of lower magnitude than those resulting from garble.

Since precision DME provides range data at the rate of 40 samples per second and digital flight control systems for an aircraft are capable of responding to discrete control input signals occurring at a rate of not greater than 5 per second, it is possible to filter the raw data output of the DME to reduce the effects of noise induced errors prior to utilization of the data in the flight control system. In present practice raw range data is filtered by an alpha-beta filter, known per se in the art, the parameters of which are selected to provide the best compromise between noise reduction and adequate control system transient response. In addition to alpha-beta filtering, the raw data processing algorithm may include means for "outlier" rejection of raw range measurements which deviate from expected values by more than a realistic amount. That is, an outlier limit may be selected such that the limit represents the maximum change in an aircraft position which could occur within the range sampling interval, given the limits on aircraft performance. Range samples which exceed the outlier may be replaced by a previous sample or they may be replaced by sample differing from a previous sample by a predetermined amount. The latter replacement process is known as a slew rate limiter.

Alpha-beta filtering and slew rate limiting are capable of reducing the adverse effects of random noise induced errors on a flight control system to a tolerable level. However, such means do not adequately reduce the effects of garble induced errors.

It is an object of the present invention to provide filtering means for reducing the adverse effects of garble induced errors in distance measuring equipment.

It is another object of the invention to provide filtering means for garble induced errors in distance measuring equipment which does not appreciably alter the ability of an aircraft flight control system to respond to valid DME signals of a transient or rapidly changing nature.

Other objects and advantages of the invention will become apparent as an understanding of the invention is gained through study of the following complete description of the invention.

BRIEF DESCRIPTION OF THE INVENTION

Briefly, the present invention comprises a method for processing the raw data output of distance measuring equipment to reduce or eliminate garble induced errors therein, whereby the median value of a set of N raw data samples is selected for further processing by alpha-beta filtering and slew rate limiting means. The output of the alpha-beta filter is then used as control input signals to an aircraft control system or displayed on a distance indicator. The process by which the median value of a set of N raw data signals is selected is hereinafter referred to as a median filter.

The median of a set of numbers $\{X_1, X_2 \ldots X_n\}$ where N is an odd number, is that number M from the set X with $(N-1)/2$ set members greater than M and $(N-1)/2$ set members less than M. The median filter is implemented by an alogorithm which may be as simple as sorting N raw data samples in ascending order and selecting the middle value or $[(N-1)/2+1]$ element of the sorted set as the median value. The recent data sample continuously replaces the oldest data sample of the set so that the process can be likened to a sliding window containing N data samples which progresses at the sampling rate. Most of the samples showing large variance from previous values are eliminated from the data stream, while the other samples are left intact. Data output from the median filter is processed in an alpha-beta filter with outlier or slew rate limiting. The data output of the alpha-beta filter is adjusted to compensate for the delay introduced by the median filter processing and then furnished to a display or to a flight control system for utilization. The only penalty upon system performance imposed by the median filter processing is the introduction of a time delay equal to one sampling interval in the data output which would appear in the absence of median filter processing and compensation for such delay is provided.

DETAILED DESCRIPTION OF THE INVENTION

Figure 1:
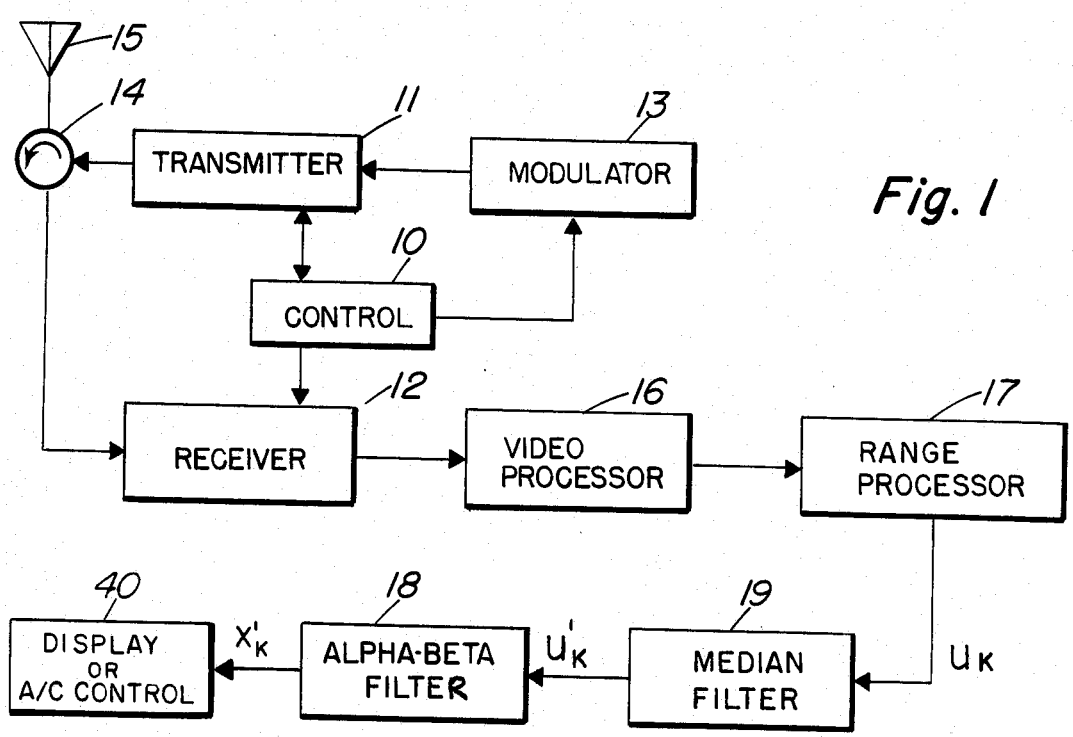
FIG. 1 is a simplified functional block diagram of a distance measuring equipment incorporating the invention.

FIG. 1 is a simplified functional block diagram of a DME airborne unit incorporating the invention. The elements of the unit are well known in the art and will be described only briefly herein. Control 10 establishes particular frequencies of operation for transmitter 11 and receiver 12 and determines the appropriate pulse spacing for the interrogation pulse pairs generated by modulator 13 as is required for communication with a selected ground station. The interrogation pulse pair output of transmitter 11 passes through circulator 14 to antenna 15 and is radiated to a ground station (not shown). The ground station, after a fixed delay from the time of reception of an interrogation pulse pair, responds by transmitting a reply pulse pair on the frequency to which receiver 12 is tuned. The reply pulse pair is received at antenna 15, passes through circulator 14 to receiver 12 where the reply signals are amplified, envelope detected and output as video pulses to video processor 16. Video processor 16 decodes the reply pulses to reject invalid signals, such as pulse pairs, which are improperly spaced or pulses of improper duration and then threshold detects the accepted reply signals to establish their time of arrival at the receiver.

Range processor 17, in simplest terms, includes a clock which is started at the time of transmission of an interrogation pulse pair and which is stopped at the time of arrival of a reply pulse pair. After compensating for the ground station fixed delay, the range to the ground station is directly available by multiplying the clock time by a constant. In order to establish coherency of the ground station reply signals and thus identify those reply signals made in response to this aircraft's interrogations, the range processor sorts the reply signals according to time of arrival into successive range bins. Counter means associated with each range bin are incremented whenever a reply signal fits the range bin and are decremented if there is no reply fitting that bin. Whenever the count accumulated for a particular bin exceeds a predetermined threshold, a range gate is established around that range bin and the processor enters a tracking mode.

While tracking, range processor 17 supplies a raw range data sample $u_k$, in conventional equipment, to alpha-beta filter 18 where the raw range data is processed with reference to previous range data to filter out the effects of random noise therein. In accordance with the present invention, raw range data $u_k$ is passed through median filter 19 to eliminate most of the garble induced errors therein and the median filter output $u_k$ is then filtered in alpha-beta filter 18 to reduce the effects of the random noise remaining therein. The output of filter 18 is then adjusted by adding a factor derived from the estimated aircraft velocity to provide a distance output $X'_k$ which includes compensation for the time lag introduced by median filter 19. $X'$ serves as an input to a distance display or an aircraft control system 40. Range processor 17, alpha-beta filter 18 and median filter 19 are implemented by microprocessor means.

Figure 2:
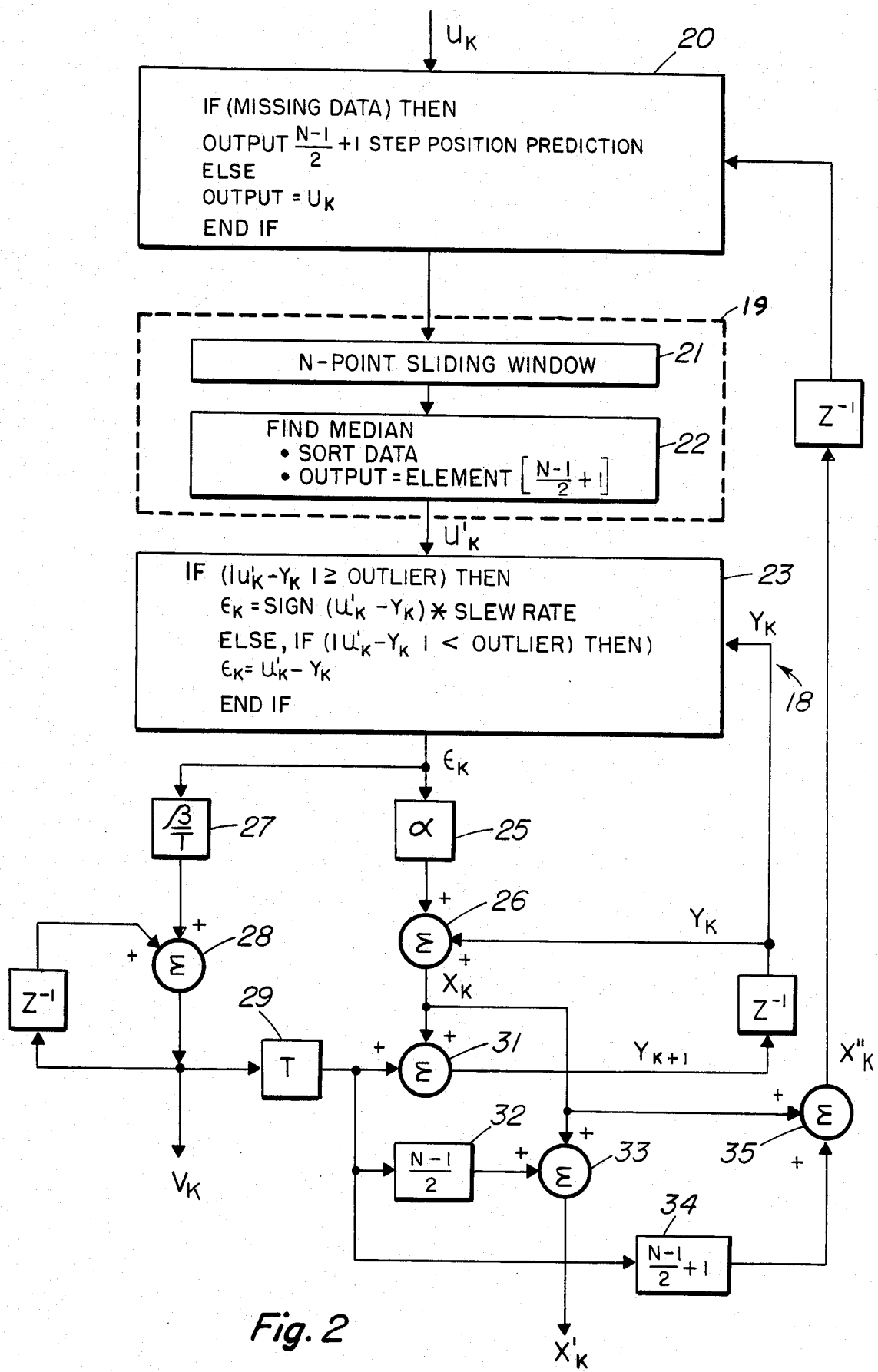
FIG. 2 is a flow chart illustrating the data processing steps of a microprocessor by which the median filter and alpha-beta filter functions of FIG. 1 are implemented.

FIG. 2 is a chart showing the steps in processing, by microprocessor means, the raw range data output $u_k$ of range processor 17 to produce the compensated range output $X'_k$ for utilization. In the description to follow, a subscript k attached to a quanity symbol indicates the value of that quantity for the current sampling interval; subscript $k-1$ indicates the value of the quantity for the previous sampling interval; subscript k+1 indicates the value predicted for the quantity for the next to follow sampling interval.

In block 20, the raw range data sample $u_k$ for the current sampling interval is received from range processor 17. If such a sample, $u_k$, is present it is forwarded directly to block 21, otherwise a predicted range value (N−1)/2+1 STEP, later described, is substituted and forwarded to block 21. Block 21 is a storage register of capacity N, where N is a predetermined odd number, such as 3, 5, 7, etc., selected on the basis of the characteristics desired for the median filter. In the preferred embodiment of the invention, N is established as 3. The register of block 21 contains the current data sample from block 20, plus the data samples from N−1 previous sampling intervals. For example, if N=3, the register of block 21 contains $u_k$, $u_{k-1}$ and $u_{k-2}$. Each sampling interval, which corresponds to each DME interrogation cycle, the current data sample $u_k$ replaces the oldest data sample contained in the register of block 21, hence the designation of block 21 as an N-point sliding window.

After entry of sample $u_k$ into the register of block 21 a sub-routine 22 entitled "Find Median" is performed in which the data of block 21 is sorted into ascending order and the value of the median element of the ordered data is forwarded to block 23. For example, if N=3; $V_k$=100; $V_{k-1}$=130; $V_{k-2}$=110, the order of data after sorting is 100; 110; 130 and the median element (N−1/2+1=2), the second element 110 of the array is forwarded as $u'_k$ to block 23.

The remaining description of FIG. 2 covers the steps of data processing comprising alpha-beta filter 18. The following symbols are used:

$u'_k$ current raw range sample selected by "Find Median"
$y_k$ range predicted for current sample interval
$\epsilon_k$ $u'_k - y_k$, augmented by outlier/slew rate limiting
$V_k$ current estimated velocity
T intersample period
$X_k$ best estimated range output
$X'_k$ adjusted for median filter time lag.

In block 23 a sub-routine is performed with the object of providing the best estimated deviation between $u'_k$ and $y_k$, the predicted value of range for the current sample interval. The absolute value of the difference between $u'_k$ and $y_k$ is compared with a constant termed OUTLIER. The OUTLIER constant may have a value of 150 feet, for example, which is a value of range change greater than could occur within the time of the intersample period T, considering the limitations on aircraft performance. If the absolute value of such difference equals or exceeds OUTLIER, the output $\epsilon_k$ of block 23 is set equal to ±SLEW RATE, the sign of $\epsilon_k$ being the same as the sign of $(u'_k - y_k)$. The value of SLEW RATE is usually selected to be somewhat greater than the range change which could occur at maximum aircraft velocity, but less than the value of OUTLIER, for example, SLEW RATE=40 feet. If the absolute value of the difference between $u'_k$ and $y_k$ is less than OUTLIER, then the output $\epsilon_k$ of block 23 is the algebraic difference between $u_k$ and $y_k$.

The microprocessor then performs arithmetic operations to solve the following equations:

$$X_k = \alpha \epsilon_k + y_k \quad (1)$$

$$y_{k+1} = X_k + TV_k \quad (2)$$

$$V_k = (\beta/T) \epsilon_k + V_{k-1} \quad (3)$$

where, in a preferred embodiment,
$\alpha$=0.125
$\beta$=0.0078
T=0.025.

As is shown, $\epsilon_k$ is multiplied by $\alpha$ in multiplier 25 and the result is added to $Y_k$ in summer 26 to produce, at the output of summer 26 a solution to equation (1). $\epsilon_k$ is multiplied by the constant $(\beta/T)$ in multiplier 27 and the result is added to $V_{k-1}$ in summer 28 to solve equation (3). The symbol $Z^{-1}$ indicates that the quantity to which this transform is applied is delayed by one sampling interval. This is accomplished by computing a quantity and storing that quantity for one sampling interval for use during the next succeeding interval. For example, the quantity $V_{k-1}$ applied to summer 28 during sampling interval k is the quantity, retrieved from storage, which appeared at the output of summer 28 during the preceding sampling interval, k−1.

$V_k$, the output of summer 28, is multiplied by T in multiplier 29 and the product is added to $X_k$ in summer 31 to provide the solution to equation (2) at the output of summer 31. The quantity $Y_{k+1}$ is stored for use during the succeeding sampling interval, k+1, in solving equation (1). The quantity appearing at the output of summer 31 during the previous sampling interval, k−1, is retrieved from storage during the current sampling interval, k, and becomes the quantity $Y_k$ used in summer 26 for solving equation (1).

The quantity $X_k$, in the absence of median filter 19, is the best estimate of the aircraft range, i.e. distance, based on the averaging action of alpha-beta filter 18 of a number of previous data samples. Inclusion of the median filter in the processing of raw data samples $u'_k$ to produce $X_k$ introduces a time lag in $X_k$ equal to (N−1/2) sampling intervals, if no garble error occurs in the N samples. That is, with no garble, the N data samples contained in the register of block 21 will be sorted in the block 22 into the same order as the order in which such samples are received so that the sample $u'_k$ selected for computation of $X_k$ is actually the data sample received during the interval k−(N−1/2). Compensation for such time lag is provided by adding to $X_k$ an estimated distance based on estimated velocity traveled by the aircraft during the period of the lag. That is, $$X'_k = X_k + (N-1/2) TV_k. \quad (4)$$

Equation (4) is solved by multiplying the product $TV_k$ at the output of multiplier 29 by the constant (N−1/2) in multiplier 32 and adding $X_k$ to that product in summer 33 to provide $X'_k$ at the summer output. To provide compensation for the median filter time lag in the quantity used to replace a missing data sample in the algorithm of block 20, the quantity $X''_k$ is computed from equation (5).

$$X''_k = X_k + (N-1/2+1) TV_k. \quad (5)$$

The quantity $X''_k$ delayed by one sampling interval becomes the (N−1/2+1) STEP used in block 20. Equation (5) is solved by multiplying the output of multiplier 29 by the constant (N−1/2+1) in multiplier 34 and adding the result to $X_k$ in summer 35. As indicated by the $Z^{-1}$ transform, the output of summer 35 is stored during the current sampling interval, and is retrieved from storage, if needed, during the next following sampling interval to serve as the (N−1/2+1) STEP in block 20.

Figure 3:
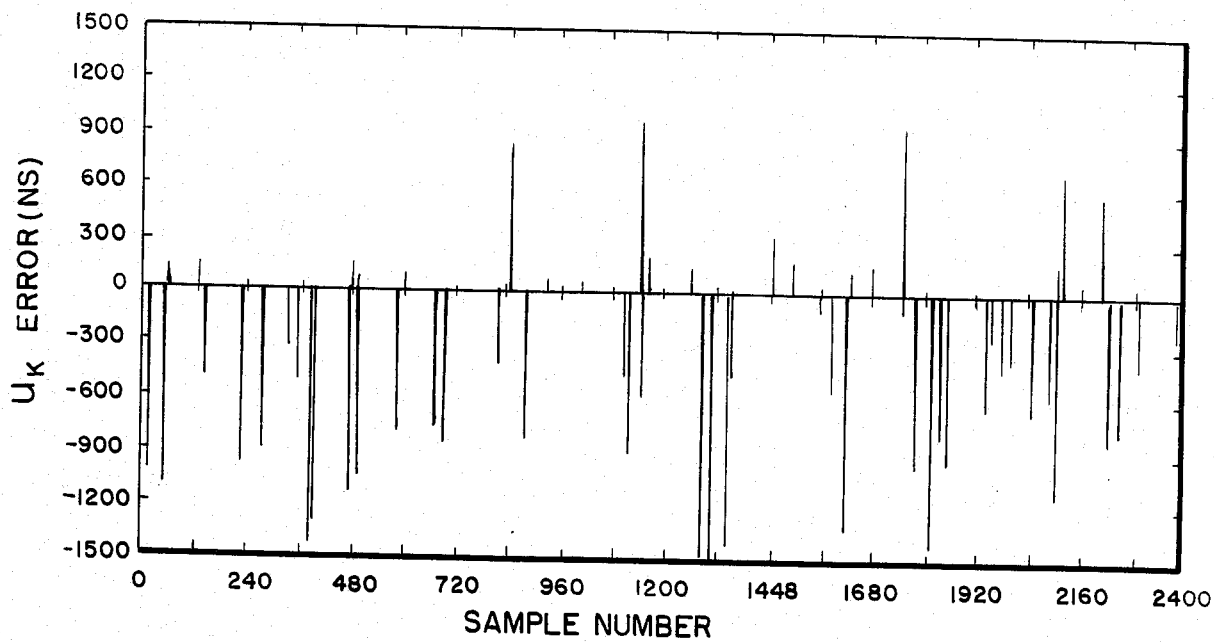
FIG. 3 is a chart produced by computer simulation showing the form of garble pulses typically present in the output of the range processor shown in FIG. 1.
Figure 4:
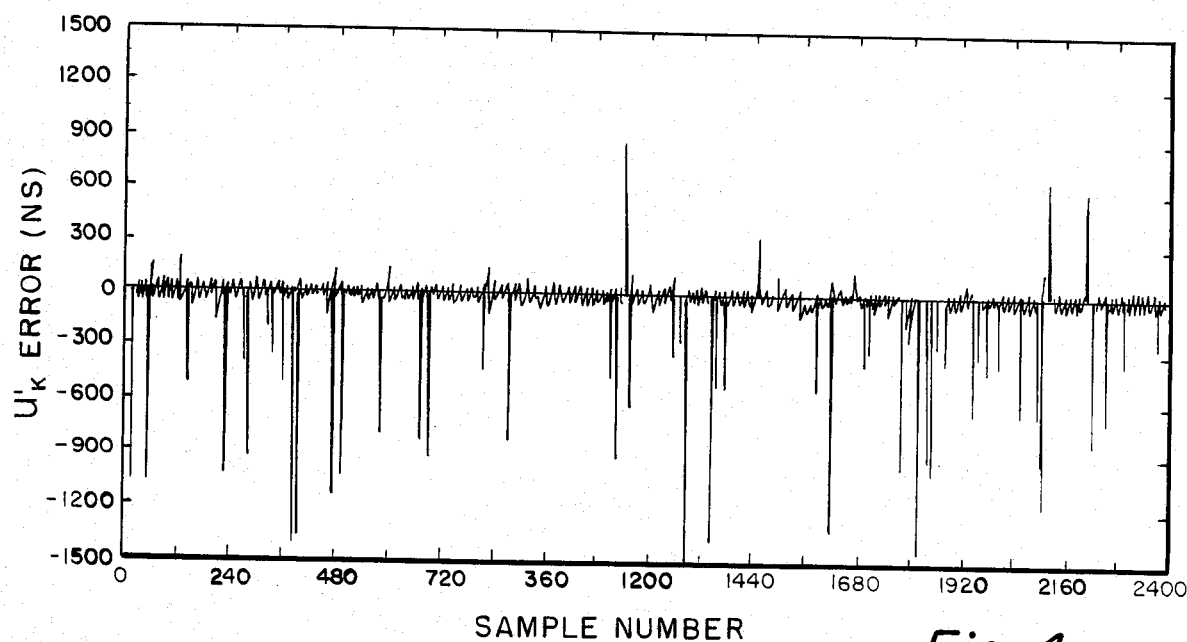
FIG. 4 is a chart produced by computer simulation showing the form of garble pulses and random noise typically present in the output of the range processor of FIG. 1.
Figure 5:
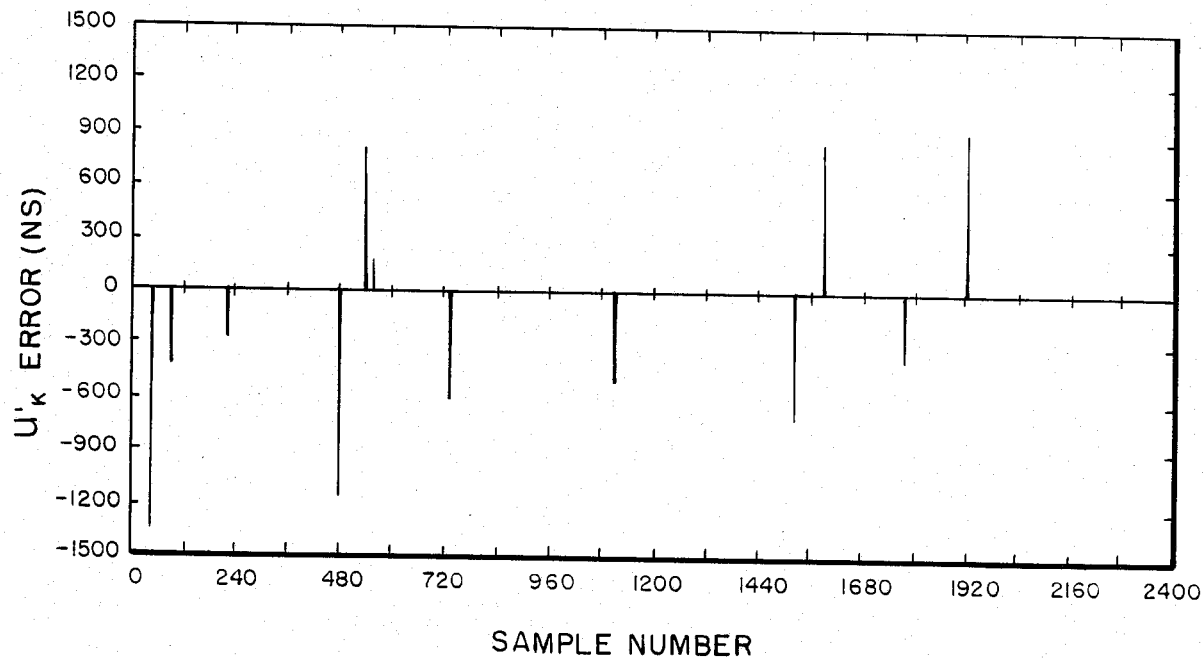
FIG. 5 is a chart produced by computer simultantion showing the output of the median filter of FIG. 1 when garble pulses as shown in FIG. 3 are applied at the median filter input.
Figure 6:
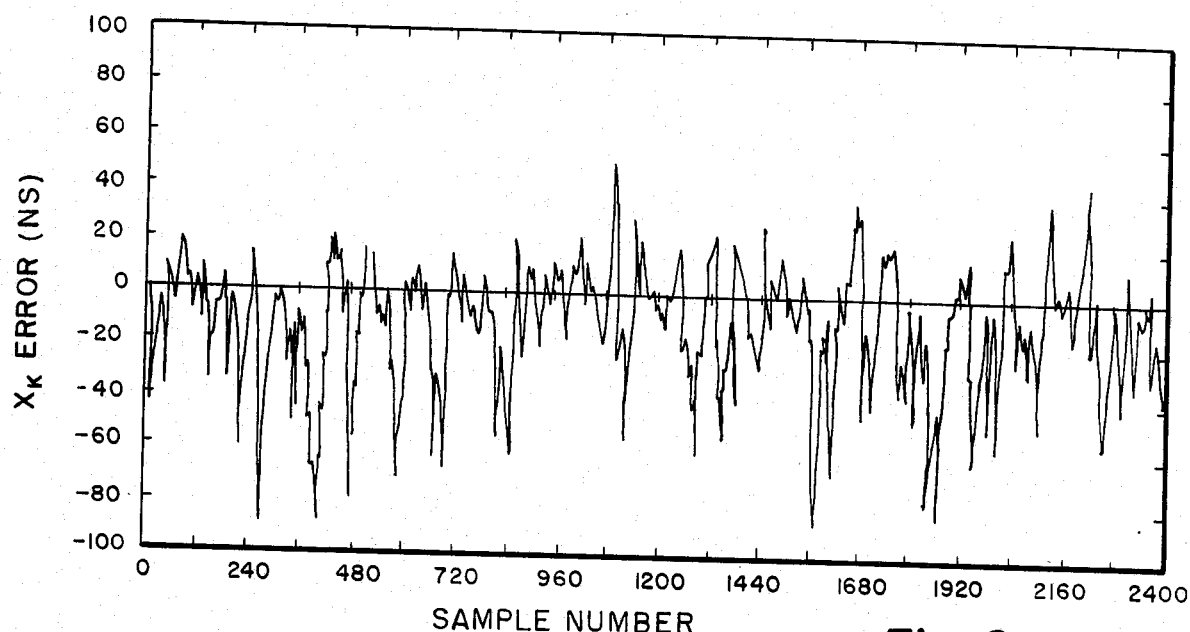
FIG. 6 is a chart produced by computer simulation showing the output of the alpha-beta filter of FIG. 1 when garble pulses and random noise as shown in FIG. 4 are applied at the alpha-beta filter input.
Figure 7:
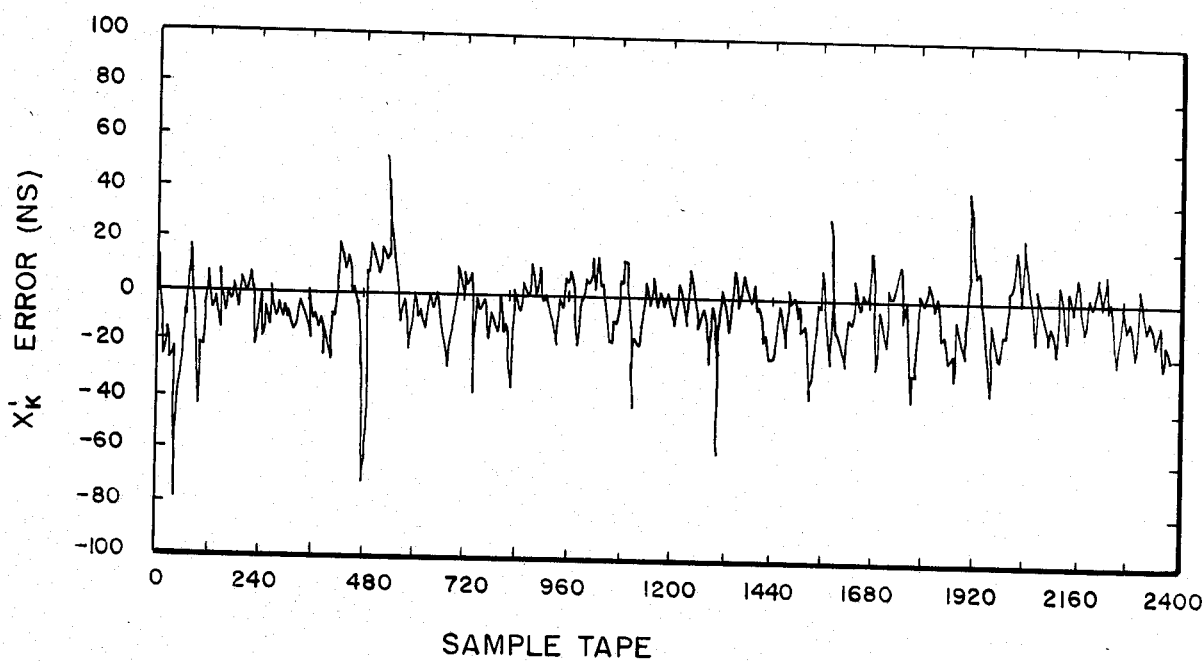
FIG. 7 is a chart produced by computer simulation showing the output of the alpha-beta filter of FIG. 1 when garble pulses and random noise as shown in FIG. 4 are passed through the median filter of FIG. 1 prior to being applied to the alpha-beta filter input.

FIGS. 3 and 4 are charts produced by computer simulation showing typical variances produced in the raw data sample outputs $u_k$ of range processor 17 by garble induced errors and by garble induced errors combined with random noise. FIGS. 5 through 7 show the reduction in the effects of garble induced errors in the raw data samples $u'_k$ afforded by an N=3 median filter, the reduction of the effects of combined garble induced errors and random noise on variances in the estimated position output $X_k$ afforded by alpha-beta filter 18 alone and the reduction in the effects of combined garble induced errors and random noise on variances in the estimated position output $X'_k$ afforded by an N=3 median filter combined with an alpha-beta filter.

FIG. 3 shows the errors induced in the raw data output $u_k$ of a DME system by mixing garble pulses occurring at the rate of 20,000 pulses per second with valid DME return signals occurring at the rate of 40 pulses per second. The ratio of the amplitudes of valid signal pulses to garble pulses is −10 db. A garble pulse has no effect on a data sample unless the garble pulse occurs within the width of the range gate centered on the valid return signal. Hence, only a few of the many garble pulses present induce errors. For example, ten errors are seen during the sample interval 0–240. The magnitudes of these errors, however, are very large, generally between 300 and 1200 nanoseconds, equivalent to between 150 and 600 feet. The abscissas scales of FIGS. 3–7 are shown in nanoseconds for convenience in computation. One nanosecond round trip elapsed time is equivalent to approximately 0.49 feet. The mean value and standard deviation of the errors shown in FIG. 3 computed for the 2400 data sample set are, respectively, −16.82 and 146.78 feet. Such data are unusable in flight control system where a standard deviation of errors in input data is specified as 20 feet, or less.

FIG. 4 shows the errors induced in the raw data output $u_k$ of a DME system by garble pulses, as in FIG. 3, and random noise, where the ratio of amplitudes of valid return signal to noise is 34 db. Here the computed mean value and standard deviation computed for the 2400 data sample set are, respectively, −23.87 and 145.33 feet.

FIG. 5 shows the reduction in the garble induced errors in the raw data output $u'_k$ of a DME system afforded by an N=3 median filter. Not all errors are eliminated since a three point filter cannot eliminate impulses with the same sign which occur in consecutive samples or which occur in samples separated by only one sampling interval. For example, the median of 0, 10, 10 or 10, 0, 10, where 10 is an error impulse is 10. On the other hand, the median of 0, 0, 10 or +10, −10, 0 is 0. Nevertheless, a three point filter eliminates a substantial number of garble induced errors, as is evident by comparing FIG. 5 with FIG. 3. The mean value and standard deviation computed for the data of FIG. 5 are, respectively, −0.65 and 26.82, both of which are significantly less than those computed the data of FIG. 3.

FIG. 6 shows the reduction afforded by alpha-beta filter 18 alone of the effects the combined garble and random noise of FIG. 4 upon the estimated position output $X_k$ of the DME system. The large variances caused by garble induced errors have been smoothed by the filter action and are seen present in the output mainly as a broadening or increase in persistance of the remaining error. The effects of random noise appear to have been completely eliminated. The mean value and standard deviation of the errors computed for the data of FIG. 6 are, respectively, −5.68 and 16.01 feet. Such data are marginally useful as input data to a flight control system.

FIG. 7 shows the reduction of the effects of the combined garble and random noise of FIG. 4 on the estimated position output $X'_k$ provided by an N=3 median filter combined with an alpha-beta filter, in accordance with the invention. Only isolated variances remain in the output $X'_k$ due to the inability of a three point median filter to eliminate all garble induced errors, as discussed above. The mean value and standard deviation of the errors computed for the data of FIG. 7 are, respectively, 6.86 and 7.03 feet, providing data completely acceptable for use as input data in a flight control system. Note that in FIGS. 6 and 7 the ordinate scale is expanded over the scale used in FIGS. 3–5. Otherwise, no noticeable error would be seen in FIGS. 6 and 7.

Obviously, modifications are possible in the data processing methods specifically disclosed herein without departing from the spirit of the invention. For example, further reduction in the effects of garble induced errors can be obtained through the use of an N=5, or higher order median filter, but at some point the greater delays associated with such higher order filters degrade the accuracy of the system output. It is to be understood, therefore, that the invention is limited solely by the scope of the appended claims.

The invention claimed is:

1. The method of processing raw data output of distance measuring equipment comprising, assembling a set comprising N number of periodic successive raw data sample outputs from airborne distance measuring equipment, said raw data samples comprising measurements of range, taken during discrete periodic sampling intervals, between said airborne distance measuring equipment and a selected ground station, said number N being an odd number, said set of successive data samples including the data sample for the current sampling interval;

arranging said N set of data samples in ascending order of value;

selecting the median sample of said arranged set of data samples, said median sample comprising the (N−1)/2+1 sample of said arranged set of data samples; and combining by means of a digital filtering process said selected data sample with a value of range predicted for the current sampling interval to produce an estimated value of range for the current sampling interval and a predicted value of range for the sampling interval next following the current sampling interval; and displaying said estimated value of range upon a distance indicator.

2. The method of claim 1 with the additional steps of:

predicting a value of range for the sampling interval second to follow the current sampling interval;

delaying for a period of one sampling interval said predicted value of range for said second to follow sampling interval, and substituting said delayed predicted value of range for said raw data sample for the current sampling interval whenever said raw data sample for the current sampling interval is missing.

3. The method of claim 1 wherein the step of combining by means of a digital filtering process includes the steps of:

delaying for a period of one sampling interval said predicted value of range for the sampling interval next following the current sampling interval;

obtaining the difference between said selected median sample and said delayed predicted value of range for the sampling interval next following the current sampling interval;

multiplying said difference by a first constant number to produce a first product;

adding said delayed predicted value of range to said first product to produce a first sum;

predicting the rate of change in range between the airborne distance measuring equipment and a selected ground station for the current sampling interval;

multiplying said predicted rate of change by a second constant related to the period of the sampling interval to produce a second product;

adding said first sum and said second product to produce said predicted value of range for the sampling interval next following the current sampling interval;

multiplying said second product by a third constant equal to $(N-1)/2$ to produce a third product; and adding said third product to said first sum to produce said estimated value of range for the current sampling interval.

4. The method of claim 3 wherein said step of predicting the rate of change in range for the current sampling interval includes the steps of:

multiplying said difference by a fourth constant inversely related to the period of the sampling intervals to produce a fourth product;

adding to said fourth product the rate of change in range predicted for the sampling interval last preceding the current sampling interval to produce said predicted rate of change in range for the current sampling interval; and storing said predicted rate of change in range for the current sampling interval for use during the next following sampling interval as the quantity to be added to said fourth product obtained during the next following sampling interval to produce the rate of change in range predicted for the next following sampling interval.

5. The method of claim 4 with the additional steps of:

multiplying said second product by a constant equal to $(N-1)/2+1$ to produce a fourth product;

adding said fourth product to said first sum to produce a predicted value of range for the sampling interval second to follow the current sampling interval;

delaying for a period of one sampling interval said predicted value of ranges for said second to follow sampling interval;

substituting said delayed predicted value of range for said raw data sample for the current sampling interval whenever said raw data sample for the current sampling interval is missing.

6. The method of claims 1, 2, 3, 4 or 5 wherein the step of:

applying said estimated value of range as an input to an aircraft control system;

is substituted for said step of displaying said estimated value of range.

* * * * *